United States Patent [19]

Shou et al.

[11] Patent Number: 5,604,458

[45] Date of Patent: *Feb. 18, 1997

[54] SCALER CIRCUIT

[75] Inventors: Guoliang Shou; Weikang Yang; Sunao Takatori; Makoto Yamamoto, all of Tokyo, Japan

[73] Assignees: Yozan Inc., Tokyo, Japan; Sharp Corporation, Osaka, Japan

[*] Notice: The term of this patent shall not extend beyond the expiration date of Pat. No. 5,457,417.

[21] Appl. No.: 457,445

[22] Filed: Jun. 1, 1995

Related U.S. Application Data

[63] Continuation-in-part of Ser. No. 191,495, Feb. 4, 1994, Pat. No. 5,457,417.

[30] Foreign Application Priority Data

Feb. 5, 1993 [JP] Japan .................... 5-042048

[51] Int. Cl.$^6$ .................................... G06F 7/44
[52] U.S. Cl. .................................... 327/356
[58] Field of Search .................... 327/336, 306, 327/337, 333, 345, 356, 554

[56] References Cited

U.S. PATENT DOCUMENTS

| | | | |
|---|---|---|---|
| 4,438,354 | 3/1984 | Haque et al. | 328/127 |
| 4,446,438 | 5/1984 | Chang et al. | 328/127 |
| 4,607,231 | 8/1986 | Nakayama | 330/51 |
| 4,716,375 | 12/1987 | van Roermund | 329/50 |
| 4,754,226 | 6/1988 | Lusignan et al. | 328/158 |
| 4,893,088 | 1/1990 | Myers et al. | 328/127 |
| 4,894,620 | 1/1990 | Nagarau | 328/127 |
| 5,142,236 | 8/1992 | Maioberti et al. | 328/127 |

OTHER PUBLICATIONS

Masry, "Strays–Insensitive State–Space Switched–Capacitor Filters," IEEE Transactions on Circuits and Systems, vol. Cas–30, No. 7, Jul. 1983.
Dorf, "The Electrical Engineering Handbook," pp. 1861–1865, CRC Press Inc., 1993.
Miyazaki, "The Analog Usage Handbook," pp. 139–140, CQ Shuppan Kabushiki Kaisha, 1992.

*Primary Examiner*—Timothy P. Callahan
*Assistant Examiner*—Jeffrey Zweizig
*Attorney, Agent, or Firm*—Cushman, Darby & Cushman IP Group of Pillsbury Madison & Sutro LLP

[57] ABSTRACT

A scalar circuit includes serially connected inverters connected to one another via a plurality of connecting lines. A plurality of input lines are provided to the input of a first inverter in the serially connected inverters. A plurality of feedback lines are provided between the input and output of each inverter. A capacitance and a switch is provided in each connecting line, input line and feedback line. The switch connects a terminal of the capacitance to ground while simultaneously disconnecting the ends of that line from one another. The switches are cooperatively actuated so that the effective composite capacitance in the feedback lines and the connecting lines are substantially equal. In addition, the composite capacitance of in the input lines and the connecting lines are substantially equal.

2 Claims, 2 Drawing Sheets

1

SCALER CIRCUIT

CROSS-REFERENCE TO RELATED APPLICATIONS

This application is a continuation-in-part of U.S. patent application No. 08/191,495 filed Feb. 4, 1994 now U.S. Pat. No. 5,457,417.

BACKGROUND OF THE INVENTION

1. Field of the Invention

The present invention relates to a scaler circuit.

2. Description of the Art

In recent years, concerns have been raised about the limitations of a digital computer because of the exponential increase in the amount of money required for investments in equipment concerning a fine processing technology. Here, an analog computer is raising attention. Inventors have developed a weighted summing circuit by capacitive coupling parallelly connecting a plural number of capacitances in analog computer that realizes a multiplication circuit. However, the range of output does not fit the range of an input necessary, and a greater level of control of the output is needed. Conventionally, a circuit realizing highly accurate variable level control is not known.

SUMMARY OF THE INVENTION

The present invention solves the conventional problems and provides a highly accurate variable level control and a scaler circuit deleting offsetting influences.

A scaler circuit according to the present invention serially connects an inverter including a feed back capacitance, performs multiplication based on a proportion of an input capacitance and the first feed back capacitance and deletes offsets of the first inverter and the second inverter.

Other objects, features, and characteristics of the present invention as well as the methods of operation and functions of the related elements of structure, and the combination of parts and economies of manufacture, will become more apparent upon consideration of the following description and the appended claimed with reference to the accompanying drawings, all of which form a part of this specification, wherein like reference numerals designate corresponding parts in the various figures.

PREFERRED EMBODIMENT OF THE PRESENT INVENTION

Hereinafter an embodiment according to the present invention is described with reference the attached drawings.

Figure 1:
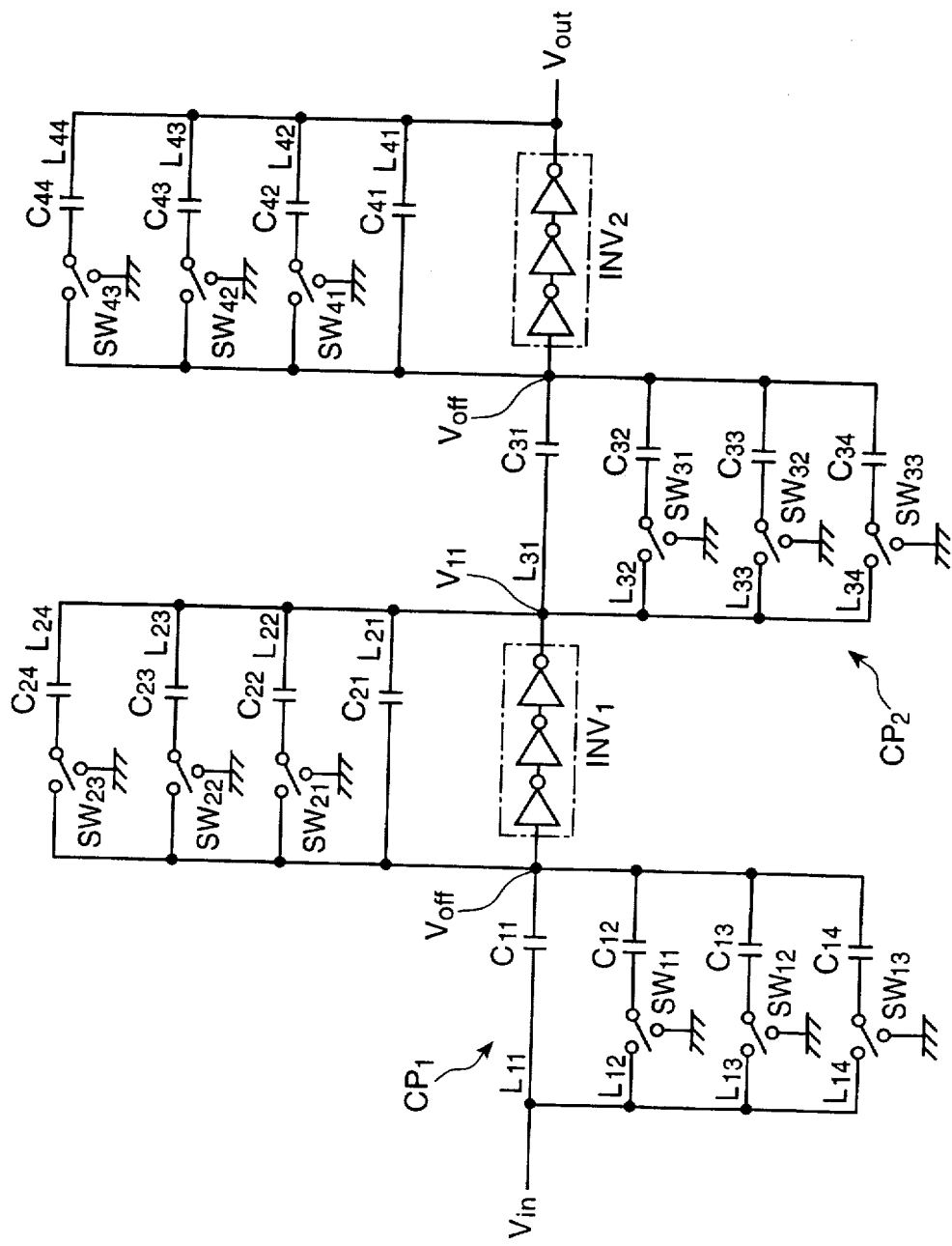
FIG. 1 is a schematic diagram of a circuit according to a first embodiment of the present invention.

In FIG. 1, a scaler circuit serially connects a first stage coupling capacitance $CP_1$, a first stage inverter $INV_1$, a second coupling capacitance $CP_2$ and a second stage inverter $INV_2$ with an input voltage $V_{in}$.

$CP_1$ includes a plurality of parallel connected input lines $L_{11}$, $L_{12}$, $L_{13}$ and $L_{14}$ including capacitances $C_{11}$, $C_{12}$, $C_{13}$ and $C_{14}$. Capacitances $C_{12}$, $C_{13}$ and $C_{14}$ are selectively connected with input lines $L_{12}$, $L_{13}$, $L_{14}$ or ground by selector switches $SW_{11}$, $SW_{12}$ and $SW_{13}$.

A composite capacitance of $C_{11}$, $C_{12}$, $C_{13}$ and $C_{14}$ is $(C_{11}+C_{12}+C_{13}+C_{14})$ and the coupling capacitance connecting $V_{in}$ to $INV_1$, which is shown as an effective composite capacity below, is $(C_{11}+\Sigma C_{1i})$. $\Sigma C_{1i}$ is the composite capacitance of capacitance $C_{1i}$ connected with an input line side by $SW_{1i}$.

A plurality of feed back lines $L_{21}$, $L_{22}$, $L_{23}$ and $L_{24}$ feed back the output of $INV_1$ to an input thereof. Capacitances $C_{21}$, $C_{22}$, $C_{23}$ and $C_{24}$ are established at $L_{21}$, $L_{22}$, $L_{23}$ and $L_{24}$. $C_{22}$, $C_{23}$ and $C_{24}$ are selectively connected to feed back lines $L_{22}$, $L_{23}$, $L_{24}$ or ground by selector switches $SW_{21}$, $SW_{22}$, $SW_{23}$ and $SW_{24}$.

A composite capacitance of $C_{21}$, $C_{22}$, $C_{23}$ and $C_{24}$ is $(C_{21}+C_{22}+C_{23}+C_{24})$ and a coupling capacitance connecting an output and an input of $INV_1$, which is shown by effective composite capacity, is $(C_{21}+\Sigma C_{2i})$. $\Sigma C_{2i}$ is the composite capacitance $C_{2i}$ connected at a side of feed back line by $SW_{2i}$.

$CP_2$ is composed of a plurality of parallel connecting lines $L_{31}$, $L_{32}$, $L_{33}$ and $L_{34}$ including capacitances $C_{31}$, $C_{32}$, $C_{33}$ and $C_{34}$. $C_{32}$, $C_{33}$ and $C_{34}$ are selectively connected with connecting lines $L_{32}$, $L_{33}$, $L_{34}$ or ground by selector switches $SW_{31}$, $SW_{32}$ and $SW_{33}$. A composite capacitance of $C_{31}$, $C_{32}$, $C_{33}$ and $C_{34}$ is $(C_{31}+C_{32}+C_{33}+C_{34})$ and a coupling capacitance, which is shown by effective composite capacity, connecting $INV_1$ and $INV_2$ is $(C_{31}+\Sigma C_{3i})$. $\Sigma C_{3i}$ is a composite capacitance $C_{3i}$ connected at a connecting line side by $SW_{3i}$.

At $INV_2$, a plurality of feed back lines $L_{41}$, $L_{42}$, $L_{43}$ and $L_{44}$ feed back the output of $INV_2$ to an input thereof. At $L_{41}$, $L_{42}$, $L_{43}$ and $L_{44}$, capacitances $C_{41}$, $C_{42}$, $C_{43}$ and $C_{44}$ are established. $C_{42}$, $C_{43}$ and $C_{44}$ are selectively connected with feed back lines $L_{42}$, $L_{43}$, $L_{444}$ or ground by selector switches $SW_{41}$, $SW_{42}$, $SW_{43}$. A composite capacitance of $C_{41}$, $C_{42}$, $C_{43}$ and $C_{44}$ is $(C_{41}+C_{42}+C_{43}+C_{44})$ and a coupling capacitance $C_{41}$, $C_{42}$, $C_{43}$ and $C_{44}$, which is shown by effective composite capacity, connecting an output of $INV_2$ and input of $INV_2$ becomes $(C_{41}+\Sigma C_{4i})$. $\Sigma C_{4i}$ is a composite capacitance $C_{4i}$ connected at feed back line side by $SW_{4i}$.

$INV_1$ and $INV_2$ have a large enough gain to guarantee a linear characteristic between the input and output relations and to generate a result which corresponds to $V_{in}$ multiplied by a proportion of the effective composite capacitance as expressed in Formula 1.

$$m=(C_{11}+\Sigma C_{1i})/(C_{21}+\Sigma C_{2i}) \qquad (1)$$

The proportion m can be controlled by switching $SW_{11}$ to $SW_{13}$ and $SW_{21}$ to $SW_{23}$. Because the accuracy of the circuit is given by the accuracy of the capacitance, which rate is not an absolute value, it easy to keep a relatively high accuracy in the LSI process.

With respect to $CP_2$ and $INV_2$, the capacitances therein are set according to formula (2).

$$C_{21}=C_{31}=C_{41}, C_{22}=C_{32}=C_{42}, C_{23}=C_{33}=C_{43}, C_{24}=C_{34}=C_{44} \qquad (2)$$

A group of switches $SW_{21}$, $SW_{31}$ and $SW_{41}$, a group of switches $SW_{22}$, $SW_{32}$ and $SW_{42}$, a group of switches $SW_{23}$, $SW_{33}$ and $SW_{43}$ and a group of switches $SW_{24}$, $SW_{34}$ and $SW_{44}$ successively switch.

Always, a relation expressed in formula (3) is guaranteed.

$$(C_{21}+\Sigma C_{2i})=(C_{31}+\Sigma C_{3i})=(C_{41}+\Sigma C_{4i}) \qquad (3)$$

Furthermore, formula (4) is set as follows.

$$(C_{11}+C_{12}+C_{13}+C_{14})=(C_{31}+C_{32}+C_{33}+C_{34}) \quad (4)$$

If every offset voltage at the input side of $INV_1$ and $INV_2$ is $V_{off}$, a relation of input and output voltage $V_{in}$ and $V_{out}$ is calculated. Output voltage of $INV_1$ is defined as $V_{11}$.

From formulas (5) and (6), formula (7) is obtained.

$$(\Sigma C_{1i}V_{in} + \Sigma C_{2i}V_{11})/(\Sigma C_{1i} + \Sigma C_{2i}) = V_{off} \quad (5)$$
$$(\Sigma C_{3i}V_{11} + \Sigma C_{2i}V_{out})/(\Sigma C_{3i} + \Sigma C_{4i}) = V_{off} \quad (6)$$

$$V_{out} = mV_{in}\{(C_{31} + \Sigma C_{3i})/C_{41} + \Sigma C_{4i})\} + \quad (7)$$
$$|\{C_{41} + \Sigma C_{4i} + C_{31} + C_{32} +$$
$$C_{33} + C_{34})/(C_{41} + \Sigma C_{4i})\} -$$
$$\{(C_{31} + \Sigma C_{3i})(C_{21} + \Sigma C_{2i})\}/\{(C_{41} +$$
$$\Sigma C_{4i})(C_{21} + \Sigma C_{2i})\}]V_{off}$$

From the relation of formulas (2) to (4), formula (8) is obtained, and offset is deleted.

$$\{(C_{41} + \Sigma C_{4i} + C_{31} + C_{32} + C_{33} + C_{34})/(C_{41} + \Sigma C_{4i})\} - \quad (8)$$
$$\{C_{31} + \Sigma C_{3i})(C_{21} + \Sigma C_{2i})\}/\{(C_{41} + \Sigma C_{4i})(C_{21} + \Sigma C_{2i})\} = 0$$

The supposition mentioned above, i.e., that offset is equal at $INV_1$ and $INV_2$, is known and the similarity between $INV_1$ and $INV_2$ is comparatively good.

As mentioned above, a scaler circuit relating to the present invention serially connects an inverter including a feed back capacitance, performs multiplication based on a proportion of an input capacitance and the first feed back capacitance and deletes offsets of the first inverter and the second inverter so that it has an effective result of realizing a highly accurate variable level control and provides a scaler circuit deleting offset influences.

Figure 2:
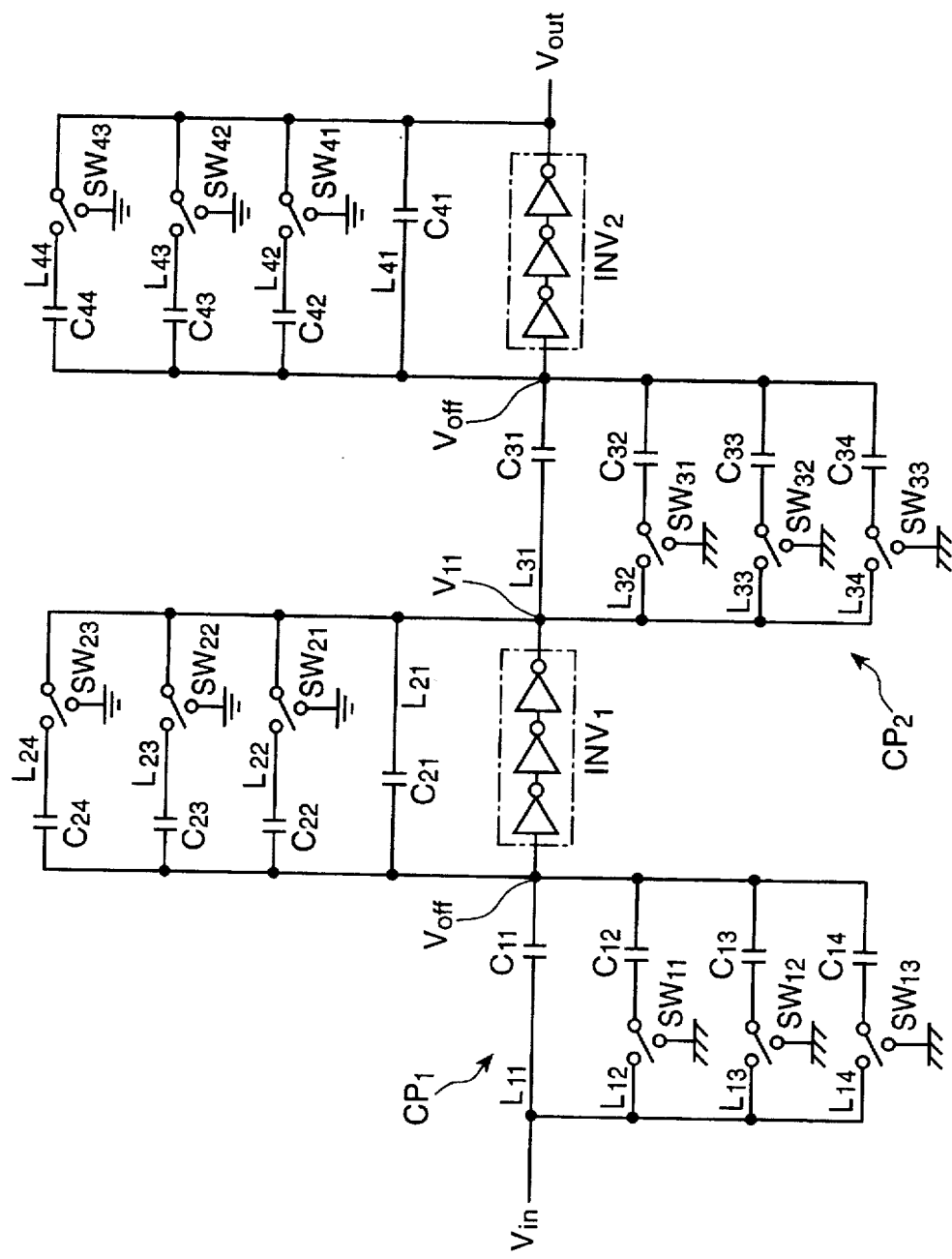
FIG. 2 is a schematic diagram of a second embodiment of the present invention.

FIG. 2 illustrates a scaler circuit according to a second embodiment of the present invention. The circuit in FIG. 2 is similar in function to that discussed above with respect to FIG. 1. However, because the location of the switches and capacitors in the feedback loops are reversed in FIG. 2 as compared to FIG. 1, the capacitances do not need to be refreshed.

While the invention has been described in connection with what is presently considered to be the most practical and preferred embodiment, it is to be understood that the invention is not to be limited to the disclosed embodiment, but on the contrary is intended to cover various modifications and equivalent arrangements included within the spirit and scope of the appended claims.

What is claimed is:

1. A scaler circuit comprising:

i) a plurality of input lines, each of said plurality of input lines having a first end and a second end, said first end of each of said plurality of input line being operatively connected to a same input voltage;

ii) a plurality of first capacitances, wherein one of said plurality of first capacitances is operatively provided in each of said plurality of input lines between said first end and second end thereof;

iii) a plurality of first switching devices, wherein one of said plurality of first switching devices is operatively provided in each of said plurality of input lines between said first and second end thereof and selectively connects a terminal of said first capacitance provided in that input line to ground while simultaneously disconnecting said first end from said second end of that input line;

iv) a first inverter having an input portion operatively connected to said second end of each of said plurality of input lines and an output portion;

v) a plurality of first feed back lines connected in parallel between said input portion and said output portion of said first inverter for feeding an output of said first inverter back to an input thereof, each of said plurality of first feed back lines having a first end and a second end, said first end of each of said plurality of first feed back line lines being operatively connected to said input portion of said first inverter, and said second end of each of said plurality of first feed back line lines being operatively connected to said output portion of said first inverter;

vi) a plurality of second capacitances, wherein one of said plurality of second capacitances is operatively provided in each of said plurality of first feed back lines;

vii) a plurality of second switching devices, wherein one of said plurality of second switching devices is operatively provided in each of said plurality of first feed back lines between said second capacitance provided in that first feed back line and said second end of that first feed back line and selectively connects a terminal of said second capacitance provided in that first feed back line to ground while simultaneously disconnecting said first end from said second end of that first feed back line;

viii) a plurality of connecting lines, each of said plurality of connecting lines having a first end and a second end, said first end of each of said plurality of connecting lines being operatively connected to said output portion of said first inverter;

ix) a plurality of third capacitances, wherein one of said plurality of third capacitances is operatively provided in each of said plurality of connecting lines between said first end and second end thereof;

x) a plurality of third switching devices, wherein one of said plurality of third switching devices is operatively provided in each of said plurality of connecting lines between said first end and second end thereof and selectively connects a terminal of said third capacitance provided in that connecting line to ground while simultaneously disconnecting said first end from said second end of that connecting line;

xi) a second inverter having an input portion operatively connected to said second end of each of said plurality of connecting lines and an output portion;

xii) a plurality of second feed back lines connected in parallel between said input portion and said output portion of said second inverter for feeding an output of said second inverter back to an input thereof, each of said plurality of second feed back lines having a first end and a second end, said first end of each of said plurality of second feed back line lines being operatively connected to said input portion of said second inverter, and said second end of each of said plurality of second feed back line lines being operatively connected to said output portion of said second inverter;

xiii) a plurality of fourth capacitances, wherein one of said plurality of fourth capacitances is operatively provided in each of said plurality of second feed back lines; and xiv) a plurality of fourth switching devices, wherein one of said plurality of fourth switching devices is operatively provided in each of said plurality second feed back lines between said fourth capacitance provided in that second feed back line and said second end of that second feed back line and selectively connects a terminal of said forth capacitance provided in that second feed back line to ground while simultaneously disconnecting said first end from said second end of that second feed back line, wherein each switching device in said plurality of second, third and fourth switching devices is cooperatively switched with other switching devices in said plurality of second, third and fourth switching devices so that an effective composite capacitance of said plurality of second capacitances, third capacitances and fourth capacitances becomes substantially equal, and wherein a sum of said plurality of first capacitances is substantially equal to a sum of said plurality of third capacitances.

2. A scaler circuit according to claim 1, wherein said first inverter and said second inverter each comprise a plurality of inverting elements.

* * * * *